United States Patent [19]

Suppelsa et al.

[11] Patent Number: 5,740,066
[45] Date of Patent: Apr. 14, 1998

[54] ELECTRICAL CIRCUIT BOARD AND CIRCUIT BOARD ASSEMBLY

[75] Inventors: Anthony J. Suppelsa; Anthony B. Suppelsa, both of Coral Springs; Henry F. Liebman, Tamarac; John M. Cook, Margate, all of Fla.

[73] Assignee: Motorola, Inc., Schaumburg, Ill.

[21] Appl. No.: 497,974

[22] Filed: Jul. 3, 1995

[51] Int. Cl.[6] ........................................ H05K 1/00
[52] U.S. Cl. .............................. 364/489; 174/250
[58] Field of Search .......................... 364/488, 481; 174/250; 361/748, 760, 761, 777

[56] References Cited

U.S. PATENT DOCUMENTS

| | | | |
|---|---|---|---|
| 4,611,380 | 9/1986 | Abe et al. | 29/430 |
| 4,791,284 | 12/1988 | Ludden | 235/487 |
| 4,825,093 | 4/1989 | Kirisedo et al. | 250/566 |
| 4,879,457 | 11/1989 | Ludden | 235/487 |
| 4,896,034 | 1/1990 | Kiriseko | 250/271 |
| 5,231,275 | 7/1993 | Wakaumi et al. | 235/449 |
| 5,268,566 | 12/1993 | Wakaumi et al. | 235/493 |

*Primary Examiner*—Vincent N. Trans
*Attorney, Agent, or Firm*—M. Mansour Ghomeshi

[57] ABSTRACT

An electrical circuit board (100) includes a substrate (101) on which a metallized bar code pattern (104) is disposed. The substrate (101) further includes an electrical circuit metallization pattern (103) which incorporates at least a portion of the metallized bar code pattern (104).

8 Claims, 2 Drawing Sheets

1

ELECTRICAL CIRCUIT BOARD AND CIRCUIT BOARD ASSEMBLY

TECHNICAL FIELD

This invention relates generally to circuit boards and particularly to circuit boards bearing coding information.

BACKGROUND OF THE INVENTION:

Electrical circuit boards or printed circuit boards "PCBs" are substrates that include metallized traces defining circuit connections and typically have electrical components soldered through a metallization pattern on the board. A manufacturer of a product incorporating a circuit board typically has a part number associated with the board. For automated assembly purposes it is often desirable to include machine readable information such as a bar code on the printed circuit assembly. Typically such identification information is printed on a sticker which is simply attached to the board. It would be desirable if such information could be included as part of another required step in the manufacturing of the board.

DETAILED DESCRIPTION OF THE PREFERRED EMBODIMENT

To avoid placing an identifying label on printed circuit boards, the present invention provides for the arrangement of otherwise useful runners in such a way to render them useful as identification codes. Specifically, the runners that are used to realize a desired circuit topology are given various widths in order to allow them to function as a bar code. This bar code is naturally printed on the substrate at the time of fabrication, hence eliminating the need for a post assembly attachment of a label. In addition, the bar code is formed using the pre-existing runners on the board so no additional space is required.

Figure 1:
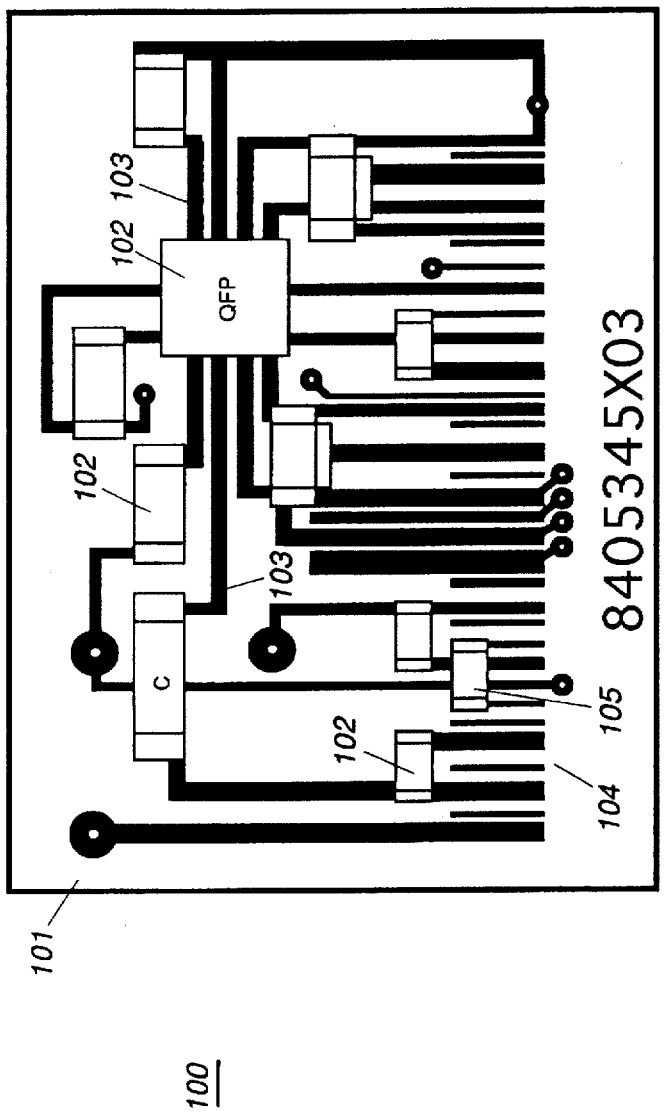
FIG. 1. top plan view of relevant portions of a circuit board assembly in accordance with the present invention.

The principles of the present invention will be better understood by referring to the attached drawings. Referring first to FIG. 1 a top view of an electrical circuit board assembly 100 in accordance with the present invention is shown. The circuit board 100 includes a circuit carrying substrate 101 on which a plurality of electrical components 102 are placed. These components 102 are connected to each other via a metallization pattern including circuit traces (i.e. runners) 103. In accordance with the present invention, a coded information metallized pattern 104 is also realized on the substrate 100. The coded information metallized pattern 104 of the preferred embodiment comprises a bar code. This bar code 104 could be scanned by conventional bar code scanners either prior to or after the population of the circuit board 100. As can be seen, some of the bars of the bar code 104 provide two functions. The first is their use collectively as an identification mark. This mark can be scanned with or without components on the board. The second use is as circuit traces on the substrate 101 for connecting components 102 thereon.

Figure 2:
FIG. 2. is a machine readable bar code.

In this embodiment, the bar code 104 as shown in FIG. 2 is duplicated on the substrate 101. The difference here is that some of the bars are used as part of the metallization pattern that realizes the function of the circuit board 100. In other words, the metallization pattern on the substrate 101 includes a portion of the bar code 104. As such, valuable space is saved on the substrate 101 while eliminating the need for a post assembly attachment of identification labels.

In order to further benefit from the principles of the present invention, an alternative embodiment provides for the direct attachment of a component 105 on the coded metallization 104. This embodiment further saves valuable space on the substrate 100 particularly in portable electronic devices where space is of premium value.

The metallized circuit traces 103 and code information metallization pattern 104 may be disposed on the substrate 101 by conventional photo imaging and etching techniques which are well known in the circuit board manufacturing.

Figure 3:
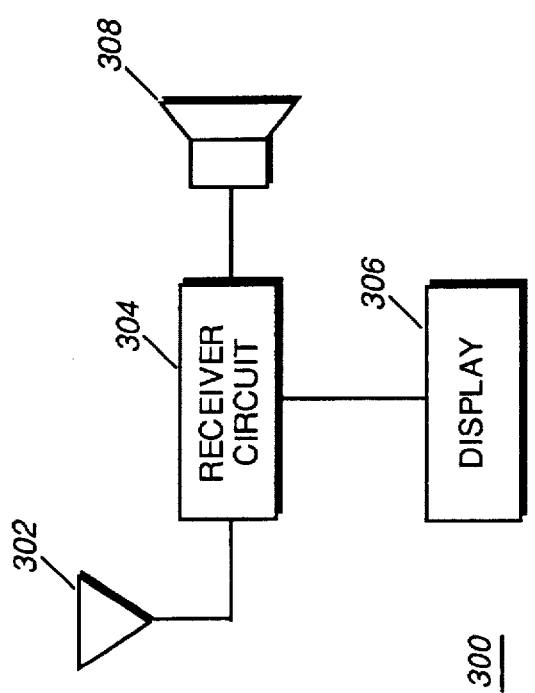
FIG. 3 is a communication device in accordance with the present invention.

Referring to FIG. 3, a block diagram of a communication device 300 is shown. An antenna 302 receives a radio frequency signal which is then coupled to a receiver circuit 304. This circuit demodulates the radio frequency signal and couples to a speaker 308 or display 306 according to its contents. At least a portion of the receiver operation is realized on an electrical circuit board similar to the board 100 disclosed in FIG. 1.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

In summary, an electrical circuit board includes the substrate 101 with a plurality of metallized circuit traces 103 thereon. A coded information metallization pattern is also disposed on the substrate 101. The coded information metallized pattern is included as at least part of the circuit trace interconnecting at least two of the electrical components 102 on the substrate 101. The coded information metallized pattern is preferably a bar code. This bar code could be used to identify the substrate 101 (unpopulated) or the assembly 100 (populated). One of the benefits of incorporating the bar code as part of the metallization pattern is the saving in space. Another benefit is the elimination of a post processing step of attaching an identification label to the substrate 100.

What is claimed is:

1. An electrical circuit board comprising:
   a substrate;
   a metallized bar code pattern disposed on the substrate; and
   an electrical circuit metallization pattern disposed on the substrate, the electrical circuit metallization pattern incorporating at least a portion of the metallized bar code pattern.

2. A circuit board assembly, comprising:
   a circuit board substrate;
   a plurality of metallized circuit traces disposed on the circuit board substrate;
   a coded information metallized pattern disposed on the circuit board substrate, at least a portion of the coded information metallized pattern forms a portion of the plurality of metallized circuit traces; and
   a plurality of electrical components located on the plurality of metallized circuit traces.

3. A circuit board assembly as defined in claim 2, in which:
   at least one of said plurality of electrical components is located on said portion of the coded information metallized pattern.

4. A circuit board assembly as defined in claim 3, in which:

the coded information metallized pattern is a bar code pattern.

5. A circuit board assembly as defined in claim 2, in which:

the coded information metallized pattern is a bar code pattern.

6. A circuit board assembly as defined in claim 5, in which:

a portion of the bar code pattern forms at least a portion of a metallized circuit trace interconnecting at least two of said plurality of electrical components.

7. A circuit board assembly as defined in claim 5, in which:

at least one of said plurality of electrical components is located on said bar code pattern.

8. A communication device having a receiver, the receiver comprising:

a circuitry for realizing at least a portion of the receiver operation;

an electrical circuit board for accommodating a portion of the circuitry, comprising:

a substrate;

a metallized bar code pattern disposed on the substrate; and an electrical circuit metallization pattern disposed on the substrate, the electrical circuit metallization pattern incorporating at least a portion of the metallized bar code pattern.

* * * * *